(12) United States Patent
Berberkic et al.

(10) Patent No.: US 10,469,094 B2
(45) Date of Patent: Nov. 5, 2019

(54) METHOD OF SIGNAL PROCESSING AND SYSTEM INCLUDING THE SAME

(71) Applicant: Leap Technologies Limited, Huddersfield (GB)

(72) Inventors: Sanjin Berberkic, Huddersfield (GB); Peter Mather, Huddersfield (GB); Roger Bromley, Huddersfield (GB)

(73) Assignee: Leap Technologies Limited, Huddersfield (GB)

( * ) Notice: Subject to any disclaimer, the term of this patent is extended or adjusted under 35 U.S.C. 154(b) by 724 days.

(21) Appl. No.: 14/894,424

(22) PCT Filed: May 28, 2014

(86) PCT No.: PCT/GB2014/051616
§ 371 (c)(1),
(2) Date: Nov. 27, 2015

(87) PCT Pub. No.: WO2014/191732
PCT Pub. Date: Dec. 4, 2014

(65) Prior Publication Data
US 2016/0126969 A1    May 5, 2016

(30) Foreign Application Priority Data

May 28, 2013   (GB) .................................. 1309505.4

(51) Int. Cl.
*H03M 1/10*   (2006.01)
*G06N 7/08*   (2006.01)
*H03M 7/16*   (2006.01)

(52) U.S. Cl.
CPC ............ *H03M 1/1014* (2013.01); *G06N 7/08* (2013.01); *H03M 7/16* (2013.01)

(58) Field of Classification Search
CPC ............................. H03M 1/1014; H03M 7/16
(Continued)

(56) References Cited

U.S. PATENT DOCUMENTS

2004/0177310 A1* 9/2004 Mohan .................. H04L 27/001
714/776
2012/0306672 A1   12/2012 Ueno

FOREIGN PATENT DOCUMENTS

WO         02/096052 A1    11/2002

OTHER PUBLICATIONS

Dmitriev et al., "Chaotic Communication Using Digital Signal Processors", Proc. NOLTA '98; vol. 3; pp. 1093-1096 (1998).
(Continued)

*Primary Examiner* — Michael P Nghiem
*Assistant Examiner* — Dacthang P Ngo
(74) *Attorney, Agent, or Firm* — Ajay A. Jagtiani; Miles & Stockbridge P.C.

(57) ABSTRACT

A method of measuring signal change including performing at least one calculation or iteration step based on one or more chaos non-linear dynamical functions on first and second input signals, or sample of signals, to produce iteration values. Performing at least a second iteration step by repeating the at least one calculation or iteration step based on one or more non-linear dynamical functions on the first iteration values to produce a second iteration values and subtracting one set of iteration values generated from either the first or second input signal from the corresponding iteration values generated from the other input signal.

14 Claims, 7 Drawing Sheets

(58) Field of Classification Search
USPC .......................................................... 702/85
See application file for complete search history.

(56) References Cited

OTHER PUBLICATIONS

Litovski et al., "Chaos Based Analog-to-digital Conversion of Small Signals", Neural Network Applications in Electrical Engineering; Neurel 20 06.; 8th Seminar, IEEE; pp. 173-176 (2006).
Silva et al., "Introduction to Chaos-Based Communications and Signal Processing", Aerospace Conference Proceedings, IEEE; vol. 11; pp. 279-299 (2000).
International Search Report and Written Opinion in International Application No. PCT/GB2014/051616 dated Mar. 12, 2016.

* cited by examiner

METHOD OF SIGNAL PROCESSING AND SYSTEM INCLUDING THE SAME

CROSS REFERENCE TO RELATED APPLICATIONS

Not Applicable.

BACKGROUND

Field of the Invention

The present invention relates to a method of measuring signal change and to an apparatus to measure the difference between a first and at least a second signal and/or samples of a signal.

Although the following invention relates to measuring signal changes in relatively basic sensors, the person skilled in the art will appreciate that the present system can be applied to any device that generates an output signal, including increasing the performance of relatively high value and/or complex sensors.

Background of the Invention

In conventional measurement systems, low amplitude parameter change measurement is a challenge due to noise and inherent measurement system errors. The traditional approach to the problem is for the measurement system to include a sensor to convert the physical parameter into a signal, typically a voltage signal, followed by conditioning circuitry to adapt to the appropriate input range of a high resolution analogue to digital converter (ADC).

The practical limitation of accuracy for any measurement is determined by specific factors such as sensor sensitivity, intrinsic noise and ADC performance in terms of bit resolution and range.

Therefore, small changes in input signal can often only be detected and/or measured using relatively expensive and sensitive equipment.

VANCO LITOVSKI ET AL, "Chaos Based Analog-to-digital Conversion of Small Signals". NEURAL NETWORK APPLICATIONS IN ELECTRICAL ENGINEERING, 2006. NEUREL 2006. 8TH SEMINAR ON, IEEE, PI, (2006090 1), pages 173-176. describes a typical one-dimensional chaotic system, a tent map. This tent map implements A/D conversion function as well as small signal amplifying function. This system can be applied to analog-to-function digital conversion of different types of signals. In order to get full characterization, three experiments were made with the circuit. A/D conversion of 1) a small dc signal. 2) a sine wave, and finally 3) a ramp signal were performed. A correction scheme, taken from literature, was applied in order to get better accuracy. In addition, simulations were performed both with ideal and realistic models of operational amplifiers so getting better information on the circuit behaviour.

US 2012/306672 A1 describes an analog-to-digital conversion apparatus that includes: a first analog-to-digital converter and a second analog-to-digital converter that are configured to convert an input analog signal into a digital signal: a difference imparting part configured to provide a difference of at least a fixed signal [alpha] between input analog signals to the first and second analog-to-digital converters, to input the input analog signals thereto; a first nonlinear compensation part and a second non-linear compensation part that are configured to compensate non-linear distortions of a first output signal and a second output signal depending on the control variable signal to be supplied: and a non-linear detection part configured to estimate how much the non-linear distortions are compensated by the first and second non-linear compensation parts depending on a first signal by the first non-linear compensation part and a second signal by the second non-linear compensation part.

It is therefore an aim of the present invention to provide an improved method signal processing addresses the abovementioned problems.

It is a further aim of the invention to provide a sensor apparatus or system that addresses the abovementioned problems.

It is a yet further aim of the invention to provide a method of signal change measurement that addresses the abovementioned problems.

SUMMARY OF THE INVENTION

According to an aspect of the invention, there is provided a method of measuring signal change including the steps of:
performing at least one iteration step based on one or more non-linear dynamical functions on a first input signal, or sample of a signal, to produce a first iteration value;
performing at least a second iteration step by repeating the at least one iteration step based on one or more non-linear dynamical functions on the first iteration value to produce a second iteration value;
storing iteration values generated from the first input signal or sample or said first input signal;
performing at least one iteration step based on one or more non-linear dynamical functions on at least a second input signal, or sample of a second signal, to produce a first iteration value from the second input signal;
performing at least a second iteration step for the second input signal by repeating the at least one iteration step based on one or more chaos functions on the first iteration value from the second input signal to produce a second iteration value;
storing iteration result values generated from the second input signal, or sample of said second signal;
subtracting one set of iteration values generated from either the first or second input signal or samples of said first or second input signals from the corresponding iteration values generated from the other input signal or sample; and
determining the difference between the first input signal or sample of said first input signal and the second input signal or sample of said second input signal by determining the number of iterations before the difference between the iteration result values increases, wherein the number of iterations before the difference between the iteration result values increases is proportional to the relative difference between the first input signal and the second input signal and/or samples thereof.

In one embodiment the method includes the steps of performing a third and/or further iteration steps on the first and/or second input signals whereby the previous or earlier iteration value undergoes the at least one calculation or iteration step based on one or more non-linear dynamical functions to generate the third and/or further iteration values.

Typically the non-linear dynamical functions is a chaos functions.

Typically the stored iteration values generated from the first input signals, or portions thereof, form a first sample signature and/or the stored iteration values generated from the second input signals, or portions thereof, form a second sample signature.

Further typically, implementing the abovementioned method using electronic circuitry and/or an integrated circuit allows high detection resolution that is independent of the input range. As it is the difference between the inputs that is measured and not the absolute value of each input, relatively low cost sensors can be modified to enable small signal changes to be accurately measured.

Preferably the iteration values and/or sample signatures are converted to digital data or a digital word. Typically the iteration values are converted to any one or any combination of digital words, binary codes, reflected binary codes (Gray codes) and then stored. Further typically an analogue to digital converter (ADC) is used to convert the values.

In one embodiment the stored digital words for each iteration form a signature or data set related to that particular input signal or sample of said signal.

Typically it is the number of iterations before the two signatures significantly diverge that is proportional to the relative difference between the input signals or samples of said signals.

Thus the speed of divergence is a direct mathematical consequence of the chaotic function being used. The skilled person will appreciate that the two signatures start to diverge at the first iteration.

Typically, it is possible to obtaining a higher resolution than that which can be achieved using a standard, comparably priced, ADC based system. The ADC, in this system, is not directly sampling the input signal or data, but rather the data at the output of the non-linear dynamical function. This allows a detection of changes smaller than if the ADC was connected in a conventional way to the input, using a linear amplification and ADC combination.

In one embodiment the one or more non-linear dynamical functions includes a one dimensional (ID) discrete chaotic map. Preferably the Chaos function is a Tent Map as shown below.

Tent Map Equation.

For $X_n < 0.5$                  equation (1)

$$X^* + 1 - * \left\{ \text{for } \frac{3}{4} > 0.5 \right.$$

Where $X_n$ represents the normalised input (typically 0 to 1), r is the fixed multiplying factor in the range (typically 1.8 to 2)

In one embodiment the non-linear dynamical function includes the Logistic Map function.

Logistic Map Equation
    equation (2)

Where $X_n$ and $X_{n+1}$ are the current and next input values respectively, r is the scaling factor set to make the function chaotic and avoid windows of periodicity, typically between 3.97 and 4.

The fundamental advantage of this signal measurement system, over typical ADCs, is that the size of the signal change that can be measured is independent of the range, thus increasing input signal range increases the overall resolution.

This high precision signal change detection and measurement system utilises the fundamental characteristic of high sensitivity to initial conditions, exhibited by the non-linear dynamical and chaotic functions. This normalised behaviour of the function means that an equivalent high detection resolution can be achieved that is independent of input range.

In one embodiment of the invention there is provided a calibration step.

In one embodiment the calibrations step is a calibration by dilution step. Typically given a known dilution value or amount, usually relatively very small, the corresponding divergence can be directly calibrated. For example, an electric field can be diluted by moving the charge a precise distance and the change calculated by the known laws of physics. Therefore, the corresponding divergence behaviour is correlated and, thus, used to calibrate the system. The same method can equally be applied to chemical substances by physical dilution.

In one embodiment the calibration step is a calibration by simulation step. Typically each iteration circuit is calibrated using a very high resolution ADC measurement which relates each input value to its corresponding output value. This is a heuristic map rather than a theoretic map i.e. it is actually how the individual circuit behaves. Given the initial calibration of an individual circuit, a mathematical map is created by interpolation between the sample points.

Further typically a signal is inputted and values are read at each iteration. This is a unique coding series. By using a very simple variant of "Newton's Method" whereby a high and low guess or estimate is made, then, depending on whether the output was too high or low, another guess is made splitting the difference, a very efficient and fast converging algorithm would recreate, through computation of the simulated maps, the exact value of the initial input. In effect, perfect calibration to any level of accuracy—given noise and quantum effects.

According to another aspect of the invention, there is provided apparatus to measure the difference between a first and at least a second signal and/or samples of a signal, said apparatus comprising:
  memory means; and
  circuitry to:
    perform at least one of calculation based on one or more non-linear dynamical functions on a first input signal or sample of said first input signal, to produce a first iteration value whereby said apparatus perform an iteration calculation by repeating the at least one calculation based on one or more non-linear dynamical functions on the first iteration value to produce a second iteration result value,
    perform at least one of calculation based on one or more nonlinear dynamical functions on at least a second input signal or sample of said second input signal, to produce a first iteration value from the second input signal or sample of said second input signal, and to perform an iteration step for the second input signal or sample of said second input signal by repeating the at least one calculation based on one or more non-linear dynamical functions on the first iteration value from the second input signal to produce a second iteration result value;
    store the iteration result values generated from the first and second input signals or samples thereof in the memory means;
    either subtract the iteration result values from the first input signal or sample of said first input signal from the corresponding iteration values generated from the second input signal of: sample of said second input signal, or vice versa; and determine the difference between the first input signal, or sample of said first input signal and the second input signal, or sample of said second signal by determining the number or iterations before the difference between the iteration values increases, wherein the number of iterations before the difference between the iteration values increases is proportional to the relative difference between the input signals or samples thereof.

In one embodiment the iteration steps are performed by circuits in series rather than repeating the calculation on the same circuit.

In one embodiment the data storage and/or subtraction is performed by a microcontroller. The person skilled in the art will appreciate that the data storage and/or subtraction steps can be performed with any device/component capable of data storage and simple mathematical operations. This includes any one or any combination of Field Programmable Gate Arrays (FPGAs), microcontrollers, microprocessors with additional memory, and specialised Integrated Circuits (IC).

In one embodiment the system is substantially integrated into a single IC and/or connected to a data acquisition board to store the signatures and/or perform the calculations using at least one computer means.

In one embodiment the apparatus is coupled to and/or integrated with a sensor output. An example of such a sensor is a strain gauge. Typically the gauge output is connected to the apparatus signal input.

In an alternative embodiment the apparatus is coupled to and/or integrated with a data acquisition board.

BRIEF DESCRIPTION OF THE DRAWINGS

Specific embodiments of the invention are now described with reference to the following figures, wherein.

DETAILED DESCRIPTION OF THE INVENTION

Chaos theory is based on functions/systems that have widely diverging outputs for small differences in initial conditions, often termed the 'butterfly effect'. This means that whilst the long-term response of the system is deterministic, very small differences in starting values/conditions lead to large differences in values at a later stage. This is completely the opposite with all classical continuous differentiable functions in calculus. However, the divergence between two chaotic responses can be used to accurately define the difference between that two input signals. The Tent Map (TM) function exhibits such behaviour and has been investigated and implemented, electronically, in this work.

Figure 1:
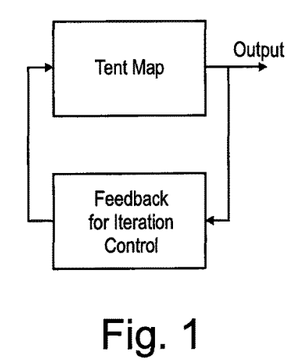
FIG. 1 shows a system illustrating the iterations of a tent map function.

There have been previous implementations of the TM and other chaotic functions using electronic circuits, however, some of these implementations are purely educational with no real application. FIG. 1 shows a system illustration of a TM function as used in associated literature.

The TM function, along with the Bit Shift/Doubling Map (BSM), has been used to measure signals in the form of an Analogue to Digital Convertor (ADC). These methods rely on the piecewise-linear characteristic of the one dimensional (I D) maps to double and fold the signal on each iteration. After each iteration the digital output is shifted to the left until a binary word that represent the input signal is obtained (binary word for the BSM and Gray-code for the TM). However, inherent practical system errors grow exponentially limiting the resolution. A chaos function scaling factor above the ideal, due to noise, would cause the output to diverge to either supply rail—known as the 'exiting condition' or 'extinction'.

The fundamental aspect of the method, presented here, is based on the unique and fully deterministic value of the signal at each iteration. When applied to signal measurement the difference between two input signals rather than the absolute value of a given signal, makes it robust to any inaccuracy within the TM parameters.

This approach adopted herein is not to design an ADC but to detect small signal changes using an implementation that takes into consideration noise and errors encountered within practical systems. Rather than relying on producing a logic output of a 0 or 1 after each iteration (or stage) the output is sampled using a low resolution ADC. The digital word for each iteration is stored in the system memory so that after N iterations a unique N Bytes signature is obtained for a given input. This signature can then be compared with any other signature to determine the difference between them using the divergence. Errors introduced by the feedback loop can be eliminated by implementing the system in a cascaded/serial configuration.

Each value is a "n-dimensional vector" that uniquely codes for the initial input. Each progressive value precisely represents the initial value with increasing accuracy.

Figure 2:
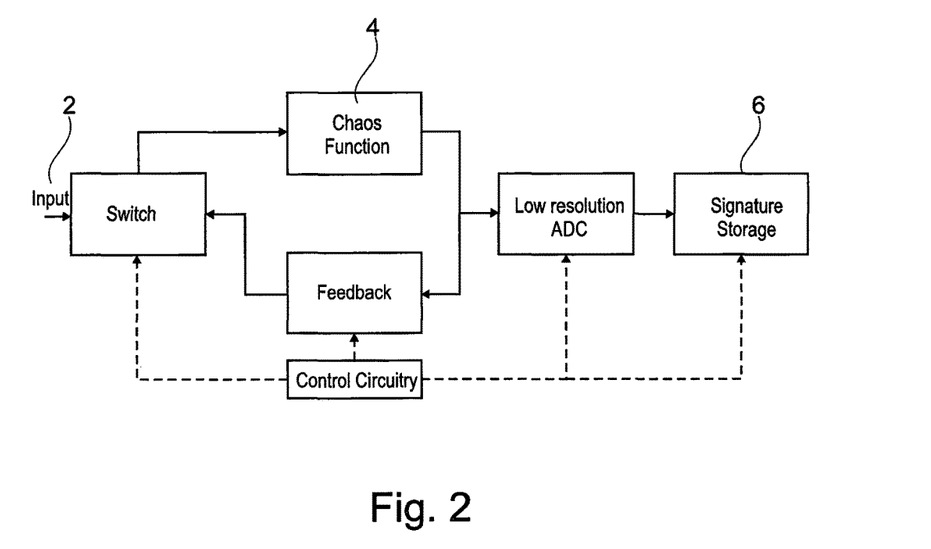
FIG. 2 shows a schematic of a chaos function based measuring system with feedback in accordance with one aspect of the invention.

As shown in FIG. 2, the present system takes the 1st input sample 2 and performs calculations based on the chaos function 4. These calculations are repeated, via the feedback loop, for a number of iterations (typically 10) with the result of each iteration being converted to a digital word and stored 6. The stored digital words, for each iteration, form a signature (data set) related to the input sample. A second input sample is taken and iterated, and the data is stored giving a second signature. The signature from the first sample is then subtracted from the second sample signature. The result obtained is then used to determine the difference between the two samples as the number of iterations before the two signatures diverge is proportional to the relative difference. The sample difference is measured and not the absolute value. The data storage and the subtraction are all performed by a microcontroller. The absolute value is entirely coded in the unique set of values of the iteration signature.

Figure 3:
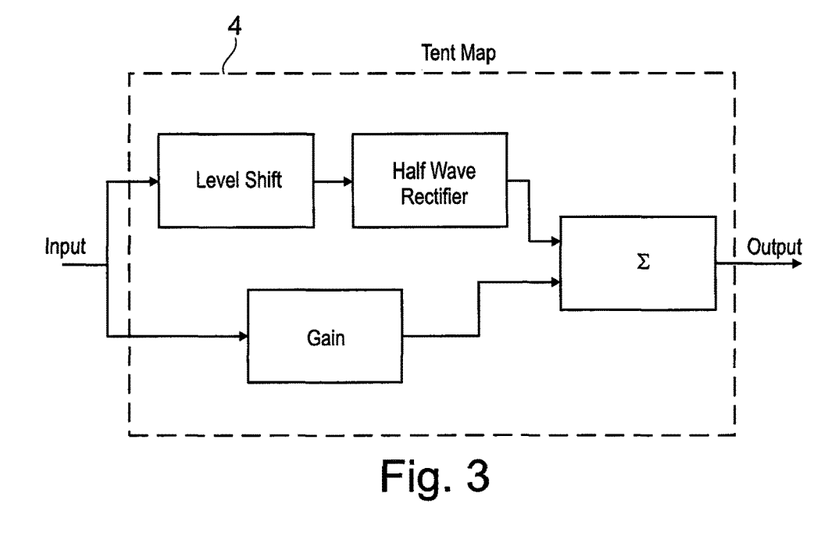
FIG. 3 shows one embodiment of the implementation of a tent map in accordance with the invention.

The discrete, I D Chaotic map, implemented electronically and tested, was the Tent Map, containing the basic system functional blocks, as shown in FIG. 3

The main advantage, of this system, is the possibility of obtaining a higher resolution than that which can be achieved using a standard, comparably priced, ADC based system. The ADC, in this system, is not directly sampling the input data but rather the data at the output of the Tent map. This allows a detection of changes smaller than if the ADC was connected in a classic way, using a linear amplification and ADC combination.

Figure 4:
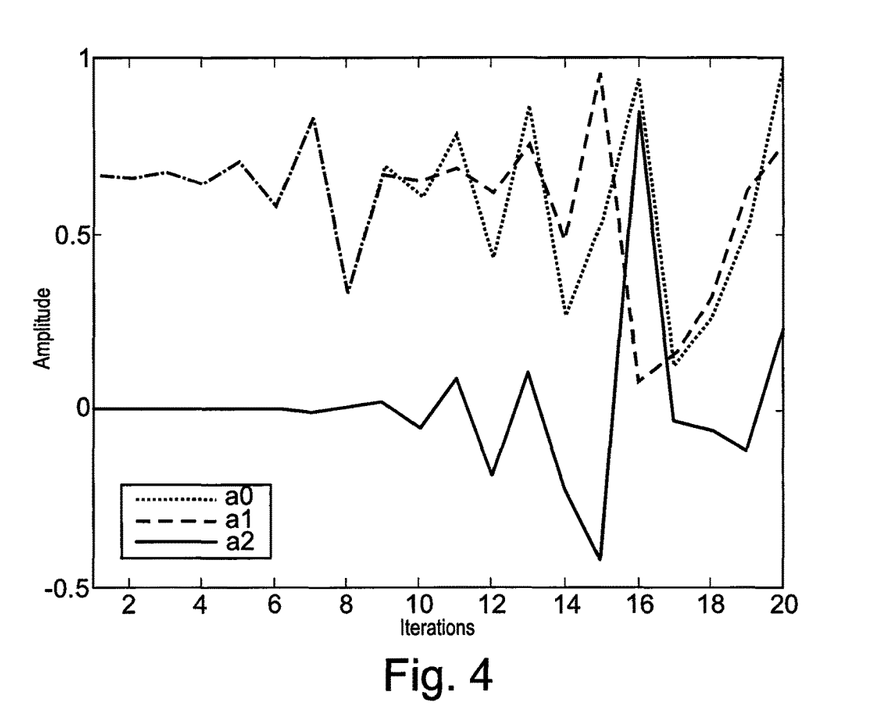
FIG. 4 shows a graph of determining sample difference in accordance with the invention.

In FIG. 4, a0 represents the Tent map behaviour over 20 iterations, for a normalised initial input condition of x=0.6, a1 is the behaviour for an initial input condition of x=0.60005, a2 is the difference between a0 and a1; showing the divergence. The number of iterations before a0 diverges from zero enables the initial sample difference to be determined.

Figure 5:
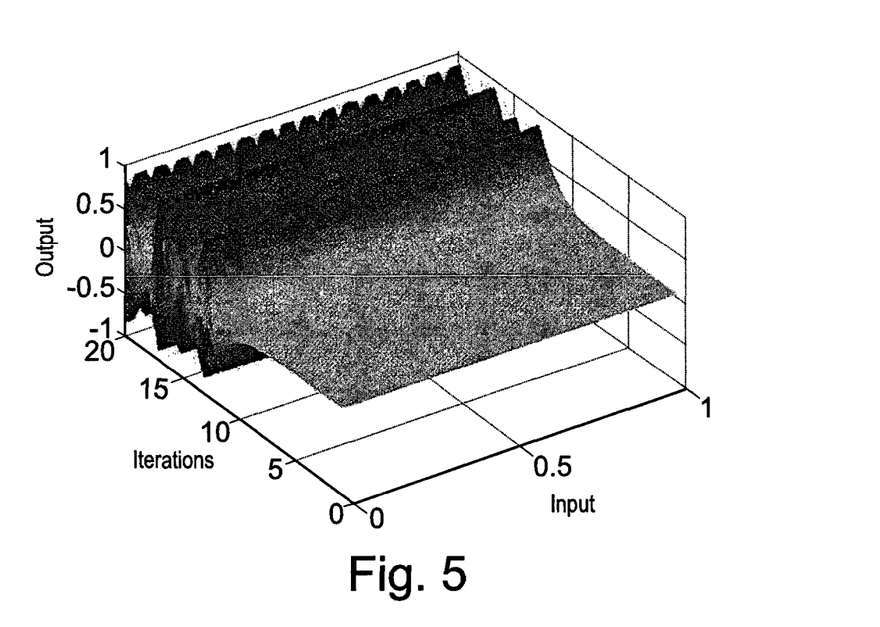
FIG. 5 shows a graph indicating the number of iterations required, to measure a specified input signal change.

FIG. 5 shows an indication of the number of iterations required, to measure a specified input signal change, is constant across the full input signal range. Hence, the measurement system is input signal amplitude independent in this example.

Figure 6:
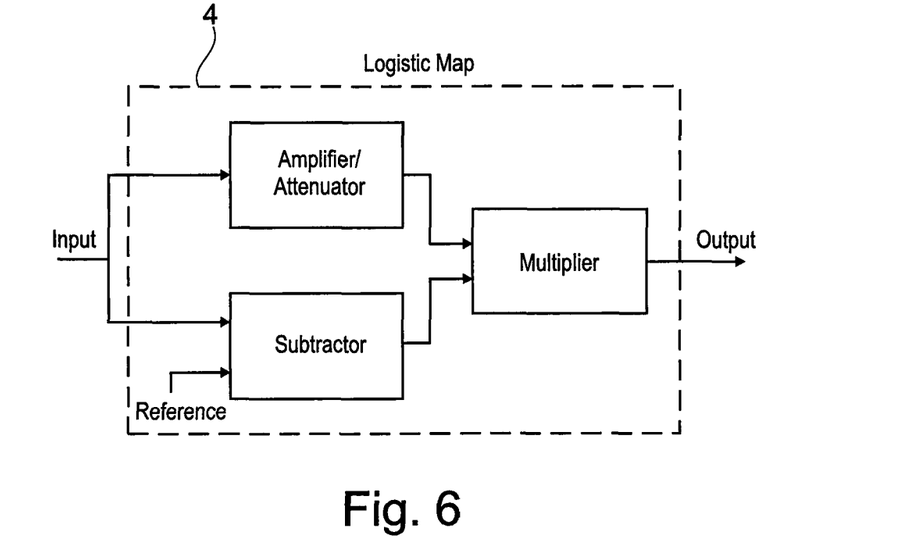
FIG. 6 shows the divergence of the tent map for a 50 v signal change across a full normalised input range.

The Tent map is not the only, one dimensional (D), discrete chaotic map 4 that can be used in the given system. Successful implementation of the I D, discrete Logistic Map (LM) containing the basic system functional blocks, as shown in FIG. 6, for the same application, has also been achieved. However, the LM and other related functions generally require multiplication circuitry, in the practical implementation. The multiplication circuitry generates relatively large quantities of noise, compared to other system blocks used, and thus introduces high noise levels into the overall system.

The simplicity of the TM (no multiplication circuitry required) enables basic electronic circuitry to be used, which only introduces relatively low levels of noise into the system. Hence the achieved performance of the practical implementation is close to the ideal, mathematically simulated, response of the TM.

The current discrete component implementation of the system can detect changes in input samples of approximately 50 µv, hence for a 10 V range (typical input voltage range for the system), the resolution is higher than that which can be achieved using a conventional 16-bit resolution ADC (10/216=1 52.6 µY per step). This system requires only a lower resolution, low cost 8-bit ADC to convert the TM response to a digital signal for storages and processing.

Figure 7:
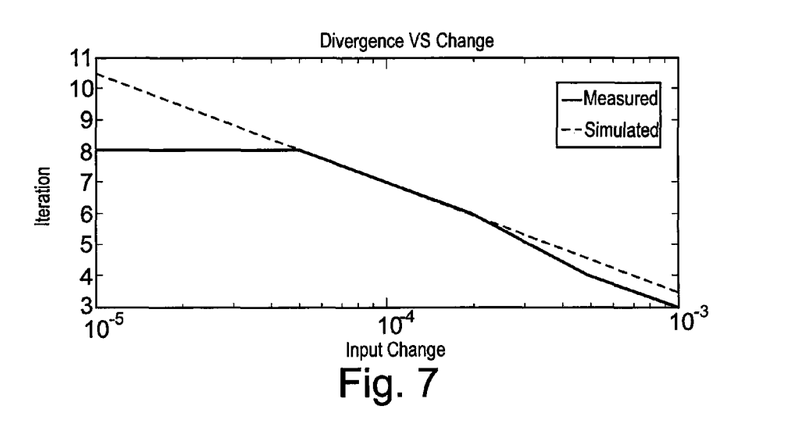
FIG. 7 shows the theoretical and practical divergence of the system versus the input change.

Although the design is implemented using a microcontroller with a built-in ADC and discrete components, the full system could be designed on a single IC. This would further reduce induced noise from circuitry within the system, meaning that smaller input signal changes could be accurately determined. FIG. 7 shows that the theoretical minimum signal change that can be measure, by the system, is limited by the noise of the practical implementation and not the TM function.

Figure 8:
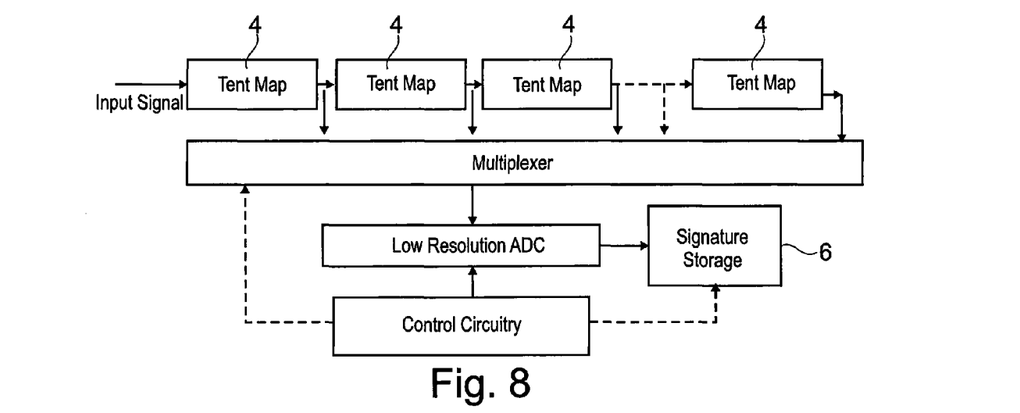
FIG. 8 shows a serial implementation of the Tent Map function in accordance with one embodiment of the invention.

By removing the need for feedback the detectable input change as low as 20µ'Y have been achieved. This was made possible by eliminating the errors introduced by the feedback, namely the sample and hold circuit. The circuit without feedback is shown in FIG. 8. Multiple TM circuits have been placed in series so that the signal, instead of being iterated can propagate through the circuits. The signature is obtained by sampling between each TM circuit.

Figure 9:
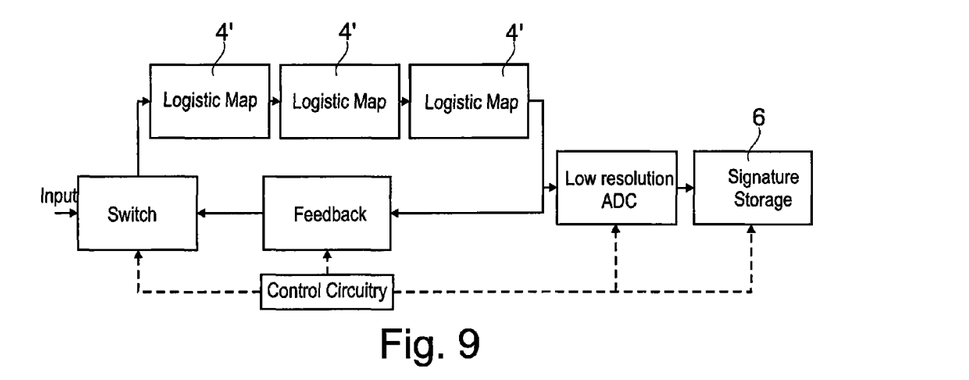
FIG. 9 shows a hybrid serial/feedback implementation of the Tent Map function in accordance with one embodiment of the invention.

Hybrid serial/feedback implementation: Combining the feedback and serial systems into one system, shown in FIG. 9, using 2 to 8 serial stages and feedback will enable flexibility and sensitivity to be optimised for different applications. The feedback system enables flexibility in iterations without the need to modify the circuitry, whilst the serial stages, enables high levels of sensitivity to be achieved whilst operating at higher speeds.

Calibration by Dilution

A vital aspect of the innovation, are methods of calibration. Calibration by dilution is based on the principle that given a known very small dilution, the corresponding divergence can be directly calibrated. For example, an electric field can be diluted by moving the charge a precise distance and the change calculated by the known laws of physics. Therefore, the corresponding divergence behaviour is correlated and, thus, used to calibrate the system. The same method can equally be applied to chemical substances by physical dilution.

Calibration by Simulation

This reconciles the apparently chaotic behaviour with the deterministic nature of the system. The calibration method is initially set up as follows. Each iteration circuit is calibrated using a very high resolution ADC measurement which relates each input value to its corresponding output value. This is a heuristic map rather than a theoretic map i.e. it is actually how the individual circuit behaves. Given the initial calibration of an individual circuit, a mathematical map is created by interpolation between the sample points.

One the system is set up, a signal is inputted and values are read at each iteration. This is a unique coding series. By using a very simple variant of "Newton's Method" whereby a high and low guess is made, then, depending on whether the output was too high or low, another guess is made splitting the difference, a very efficient and fast converging algorithm would recreate, through computation of the simulated maps, the exact value of the initial input. In effect, perfect calibration to any level of accuracy—given noise and quantum effects.

For example, given a Tent Map, f(n), such that f(2)=0.75*(1−|f(1)−0.5|), the table below show an actual starting value with low and high guess, then a split value.

|  | Actual | Low | High | Split |
| --- | --- | --- | --- | --- |
| Iteration 1 | 0.71256 | 0.70000 | 0.72000 | 0.71000 |
| Iteration 2 | 0.43116 | 0.45000 | 0.42000 | 0.43500 |

Thus the split value accurately fixes the second decimal place i.e. 0.71. The subsequence decimal places are similarly fixed by subsequent iterations.

This also ties together in a very logical and mathematical pleasing way the fact that all the values are of equal importance and the notion of "divergence" is trivial. Thus the series:
0.71256
0.431 16
0.64673

0.52990
0.70515
0.44228
0.66341
0.50488
0.74268
0.38598
0.57897
0.63154
0.55269
0.67097
0.49355
0.74032
0.38952
0.58428
0.62358,
over 20 iterations, of unique and completely deterministic values increase the accuracy of the ADC by 106.

Signal "Vectors"

As the basic system is particularly equipped to detect changes in strength to very high levels of accuracy, this could be implemented in a sweep or scan mode to detect small signal variation in a chemical or electrical "potential field". The midpoint would act as a directional vector towards the source. Furthermore, due to high dynamic range, the system would not be overwhelmed even if the source is millions of times stronger than the initial field strength. Indeed, we speculate that is already used by nature when simple creatures such as moths can locate a mate from over a 1 km way starting with a single pheromone molecule.

Large Scale Embodiment in an Integrated Circuit

It is mentioned the current patent document but the use of a large scale array on a single IC could be very important to remove noise and/or add performance through a sort of "neutral network", again as is modelled in nature.

Applications of the invention include:

Small Change Physical Parameter Measurement

Figure 10:
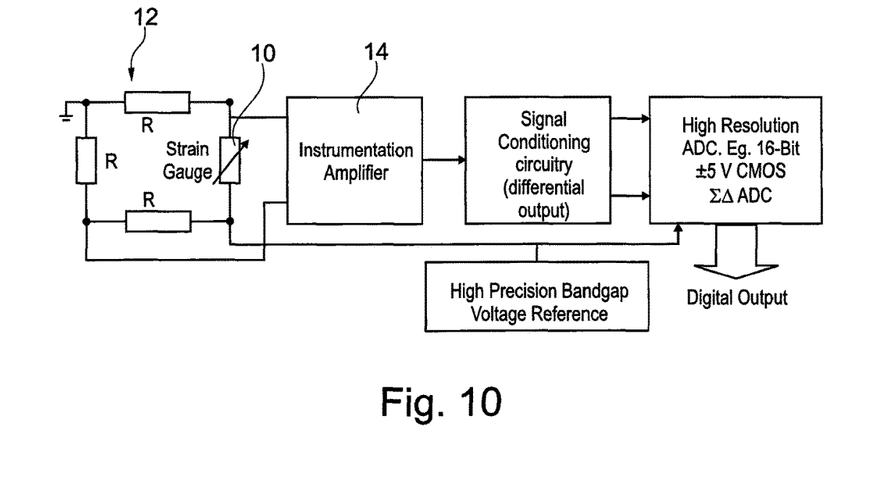
FIG. 10 shows a schematic representing a strain gauge.
Figure 11:
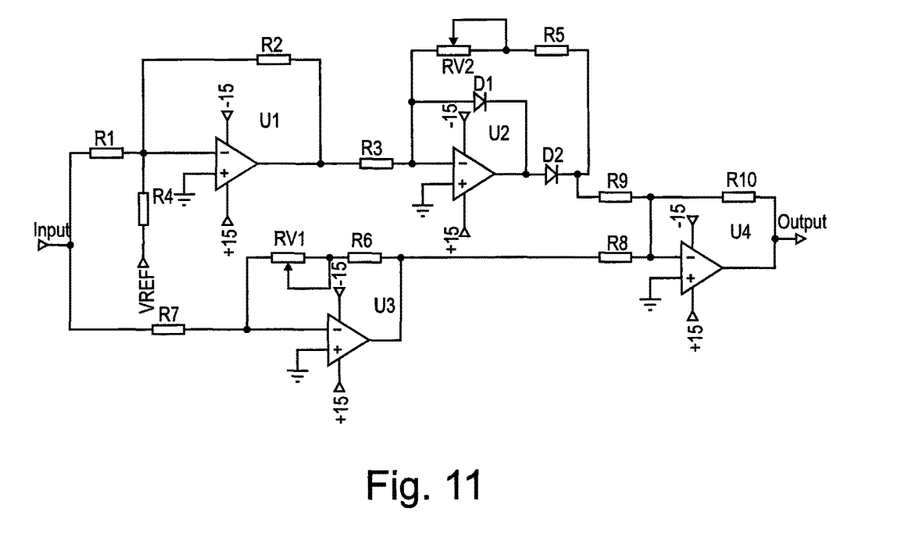
FIG. 11 shows a circuit diagram for a Tent Map electronic circuit implementation.

A typical area of application for the signal change measuring system is that where a small variation in the output signal from a physical parameter sensor is required as opposed to absolute values. For example, a strain gauge 10 can be used to detect small strain variations over a wide initial signal range. The method normally used for this application is shown in FIG. 10.

The change in strain, to be measured, creates a change of resistance at the terminals of the strain gauge, which is relatively small (typically in the order of tens of mΩ) compared to the typical nominal value of the strain gauge of 350Ω, for example. The gauge is placed in a Wheatstone bridge resistor (R Ω equal to the nominal strain gauge resistance) configuration in order to convert the strain gauge resistance variation, which is proportional to the strain applied, into a voltage. The voltage is then amplified by an instrumentation amplifier 14 (low noise and high precision) before being adapted/conditioned to the input range of the ADC. This conditioning circuit is generally application and ADC dependent and requires relatively high cost precision amplifiers. However, the system is able to determine absolute value measurements to high precision levels but requires expensive high resolution ADCs.

If a small change in the strain, equivalent to an extension of 0.00001% over a ±10% extension/compression range, occurs then the minimum resistance variation of 0.0007Ω over a range of ±35Ω needs to be detected. The maximum voltage at the output of the Wheatstone bridge in the, given example, was calculated to be ±0.119V. Using a 16-bit ADC the minimum voltage change that can be detected is determined as being equal to 76.3 µv for a 5 V reference ($5/2^{16}$). Given the conditioning circuitry, the minimum ADC step sizes equates to 3.66 µv bridge output voltage (minimum required to maintain full ADC range), which is equivalent to a 1ηΩ change, which in turn is equivalent to a 1.43 micro strain change. However, since the measurement accuracy of the new system is 20 µv a strain change of less than 1 micro strain can be detected. Hence, because of a need for detecting small changes over a wide absolute range, the 16-bit resolution of the ADC is not high enough. In fact for the conventional system a more costly 18-bit ADC to attain the same level of accuracy (1 micro strain) would be required.

Increased Data Acquisition Capability.

Initial investigations indicate that the new signal change measurement system can be used to improve the detection capability of existing data acquisition systems. For example, an acquisition board equipped with an existing 8-bit or 12-bit ADC can be expanded, with the addition the new system, to obtain resolution levels in the order of 18-bits. The added advantage is that the resolution of the overall acquisition system will be increased as well as the approximate absolute measurement values still being available.

Figure 13:
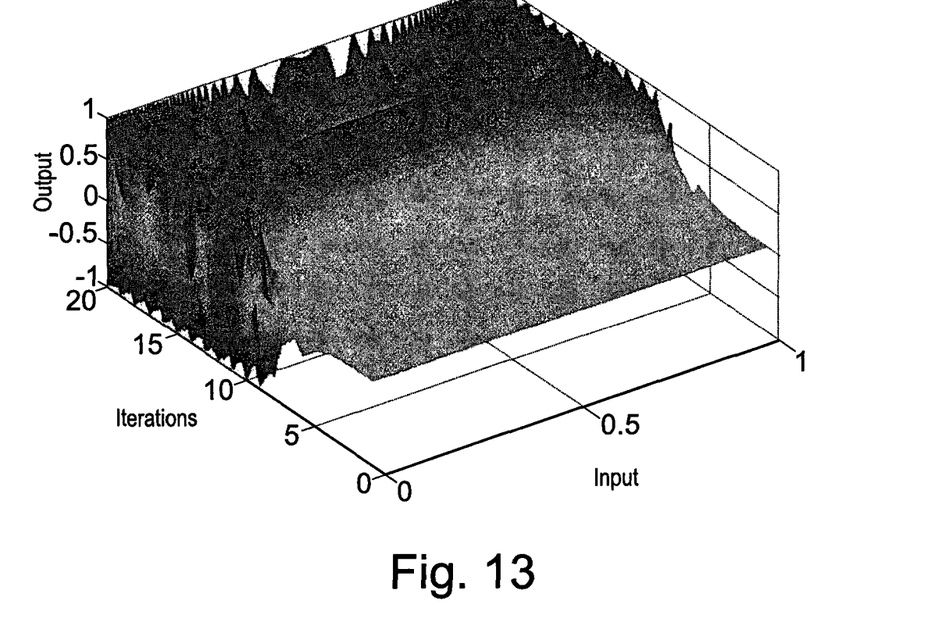
FIG. 13 shows a graph illustrating signature deviations for input signals and a $1 \times 1 O^4$ change for the Logistic Map.

The skilled person will appreciate that the electronic circuit implementation of the Tent Map chaotic function, using low cost components, as shown by the simplified circuit in FIG. 13 enables signal changes in the region of 20 v to be accurately measured. The potential range of applications for this system is very large. The integration of the measurement systems onto a single IC will improve the level of accuracy and lower costs, thus increasing the scope of potential applications.

In a final example a high precision signal measurement system utilising the Logistics Map chaos function is presented.

Essentially a novel, high precision signal change measurement system based on the Logistic Map (LM) has been developed, analysed and tested. The measurement technique utilises the high sensitivity to initial conditions characteristic of the one dimensional Chaotic function. Investigations into the behaviour of the LM function, using Matlab, demonstrated that the deviation between successive output iterations for two or more input signal samples is proportional to the size of the difference between them. An electronic prototype of the LM based measurement system has been developed, using low cost electronic devices, and the results demonstrate a strong relationship to the simulations, thus input signal changes can be accurately detected and quantified. Analysis of the measurement system has shown that input signal changes of 100 µv can be determined, equivalent to 16-bit ADC resolution, over a 10V input range. The fundamental characteristic difference compared to typical ADC devices is that the size of the signal change that can be measured is independent of the input range, thus increasing the input signal range increases the resolution. This system is highly suited to applications where the detection of low amplitude signal sample change is of higher importance than the absolute value.

Introduction: To accurately observe, test and control any physical variable, a high resolution 'measurement system (MS)' is required. In most engineering systems, low amplitude parameter change measurement is challenging due to practical noise limitations and inherent measurement system errors. In the classical approach to the problem, the MS consists of a sensor to convert the physical parameter into typically a voltage signal, followed by conditioning circuitry to adapt to the appropriate input range of a high resolution 'analogue to digital converter (ADC)'. The practical limitation of accuracy for any MS is determined by specific factors such as sensor sensitivity, intrinsic noise and ADC performance in terms of bit resolution and range. This high precision signal change detection and measurement system utilises the fundamental characteristic of high sensitivity to initial conditions, exhibited by the chaotic function. This normalised behaviour of the function means that an equivalent high detection resolution can be achieved that is independent of input range.

Chaos: Chaotic behaviour can be observed in many non-linear systems that exhibit irregularity and unpredictability and show high sensitivity to initial conditions, commonly known as the 'butterfly effect'. Although, deterministic and commonly following simple algorithms, chaotic systems display complex behaviour, which in contrary to a linear system, the resultant divergence between two close starting parameter values is exponential. This property is thus used to detect small changes in the initial input conditions taken from a sensor. The simplest way of investigating this phenomenon is to use a discrete One-dimensional (I D) ' chaotic map—'logistics map (LM)\

Logistics map: The LM, is analogous to the logistics equation created by the mathematician Pierre Fran9ois Verhulst and given by the difference equation (2).

The behaviour of one dimensional chaotic functions has been widely studied and a number of implementations and applications have been proposed, over a wide range of different disciplines, such as optics, communications and electronic engineering. In a simple electronic implementation of the LM has successfully been used to design a secure communication system.

The I D tent map and dyadic functions have been used to measure signals in the form of an ADC, where the piecewise-linear characteristics are doubled and folded. The binary word is obtained from each successive iteration (logic 1 above the threshold and 0 below). These ADC signal measurement methods would only produce high resolution digital outputs, if the respective scaling parameter and the threshold are ideal values. However, inherent practical system errors grow exponentially limiting the resolution. Furthermore, a scaling factor above the ideal, due to noise, would cause the output to diverge to either supply rail— known as the 'exiting condition' or 'extinction'.

This presented implementation is the first instance of a chaos function being used for signal change detection and is insensitive to system noise and parameter accuracy.

Signal change measurement technique: Matlab simulations were used to determine the validity of the measurement system based on the I D LM chaos function. Firstly, the input value $X_n$ is applied to the LM function and the resulting output fed back (iterated) a number of times, with the corresponding signature (output value per iteration) stored. A small change is applied to the input and the analysis re-run, where the resultant signature of the second analysis is subtracted from the first to obtain the difference signature. The iteration point where divergence occurs between the respective signatures was found to be proportional to the amplitude of the change in successive input signal samples.

Figure 12:
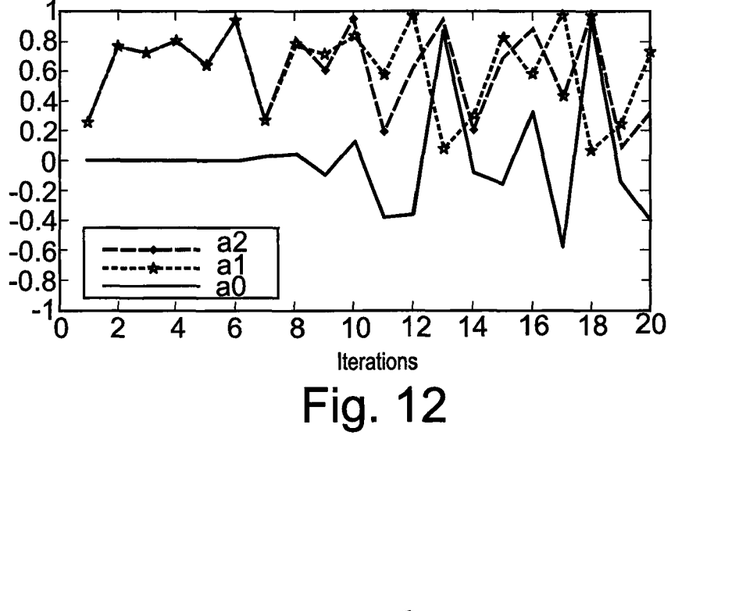
FIG. 12 shows a graph demonstrating sensitivity to initial condition change of $1 \times 1 O^4$ for the Logistic Map function.

In FIG. 12, the input $X_n$ was set to 0.6 of the normalised input range and the map iterated 20 times (a1). The process was repeated for $X_n=0.6001$, and iteration signature (a2) subtracted from (a1) giving the difference (a0). It can be observed that from iteration 1 to 6 there is no significant deviation in the two signatures a1 & a2; however divergence increases for subsequent iterations. By reducing the amount of deviation between successive input signal samples, it was noted that the iteration at which divergence occurs is proportional to the size of the sample difference. Simulations demonstrated that sample changes of magnitudes $1\times10^{12}$ or less, exhibit signature divergence proportional to the input sample change.

In order for this signal change, measurement technique to be valid, two successive samples taken at different times and at different amplitudes, but with the same difference should diverge at the same iteration with the same magnitude range. To determine the consistency and repeatability of the technique, a three dimensional simulation graph was developed, as shown in FIG. 13, where the signature divergence over the full normalised input range, given a $1\times10^4$ change, is shown. It can be observed that the iteration where the divergence is above a specified threshold is constant in the normalised input signal range of 0.1 to 0.9. The non-linear regions 0.1 and >0.9, exceed the threshold at an earlier iteration, hence these input ranges were avoided in the implemented signal measurement system.

Figure 14:
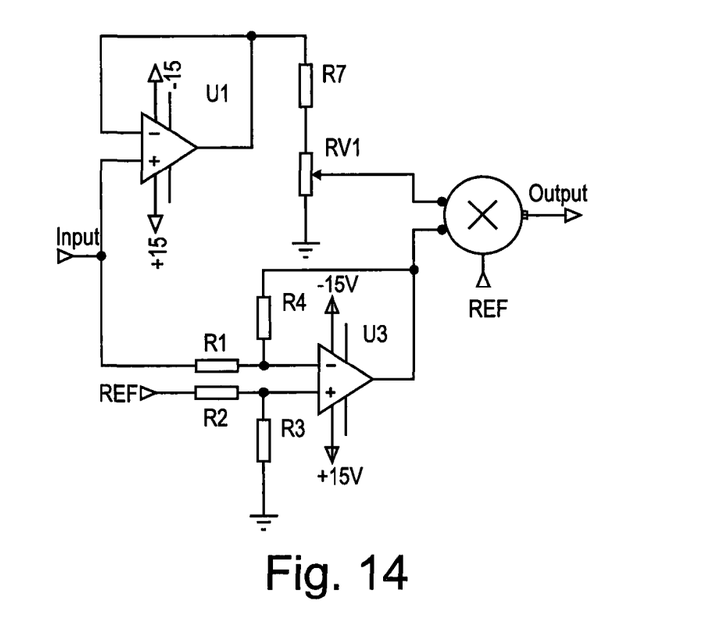
FIG. 14 shows a circuit diagram for a Logistic Map electronic circuit implementation.

System implementation: The LM function, given in equation 1, was implemented utilising readily available low cost electronic components, as shown by the simplified circuit in FIG. 14, using equation (3); the scaled LM equation for a 10 V input range.

$$X_{n+1}=rX_n(10-X_n) \quad \text{equation (3)}$$

Figure 15:
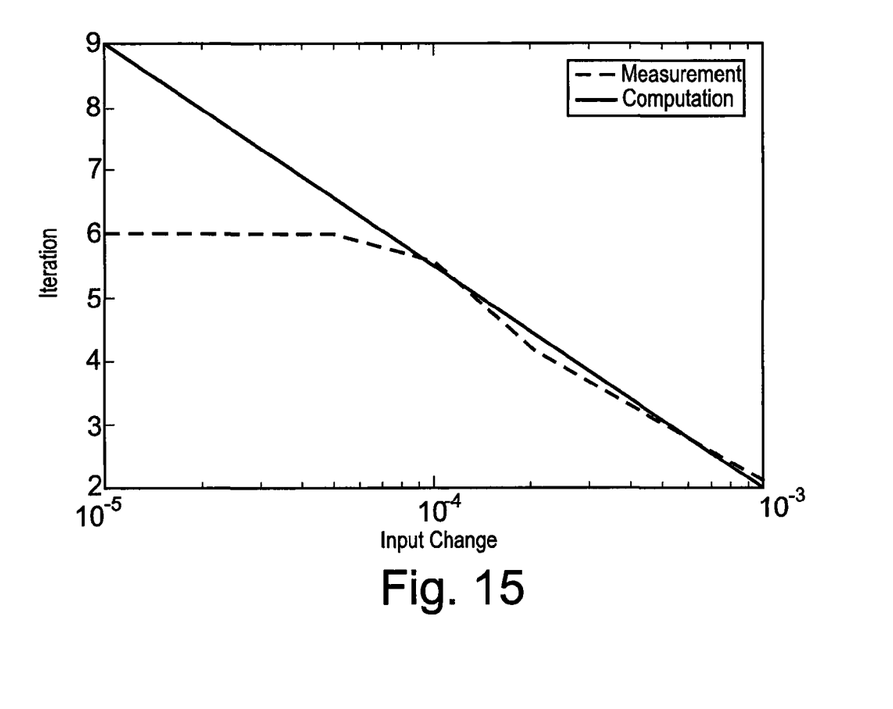
FIG. 15 shows a graph of measurement system input change detection compared to theoretical analysis.

This LM circuit is incorporated into a microcontroller based feedback system, which utilises a low 8-bit ADC to enable storage of the signatures but not used to detect the input signal change. Extensive analysis of the practical system demonstrates a strong correlation with the Matlab simulations, with the minimum change that can accurately be determined in the practical system, after 6 iteration, being $1\times10^4$, as shown in FIG. 1 5. The computed and measured results in FIG. 1 5, show the number of iterations where the accumulated deviation between successive signatures, due to input signal difference, exceeds a specified threshold.

The signal change of 1 00 μv that can currently be detected, is limited by the practical system induce noise, which is dominated by the multiplier circuitry.

The theoretical Matlab analysis, shown in FIG. 1 5, demonstrates that by reducing induced signal noise through improved circuit implementation, signal change detection an orders of magnitude lower is possible. Further improvements in the multiplier design and increased signal range, should enable signal changes in the region of $<1\times10^5$—20-bit resolution, to be achievable.

CONCLUSIONS

A signal change measurement system based on the I D LM chaos function has been success fully developed using low cost electronic devices. The system can accurately and consistently measure signal changes of 100 μM in the region of 1 V to 9 V of a 1 0 V input range, equating to a 1 6-bit ADC resolution. The fundamental advantage of this signal measurement system, over typical ADCs, is that the size of the signal change that can be measured is independent of the range, thus increasing input signal range increases the overall resolution.

Thus a low-cost ADC could, using the technique, performs like a higher co st ADC. Also, there are many cases when the system could be extremely expensive but produces ultra-sensitive measurements—e.g. gravity waves—and is not merely a low-cost replacement. The system could also be used for a binary purpose, e.g. the presence of a toxic material or not. In which case, the extreme sensitively is exploited but not as an ADC. The analogue circuit would respond resulting in a simple binary output.

The system can also be used as a very precise signal filter. The reason is all dynamical functions map to themselves, therefore, there has to always be a single point that maps to itself. Any value higher or lower will diverge, given sufficient iterations. Therefore, the system will filter out any values to any level of accuracy.

Essentially all wireless communication devices e.g. mobile phones, are EM sensors. Therefore, a significant field of application is envisaged to be wireless communication. The benefits include superior signal detection by the device (better connection), reduce need for masts, faster data transmission, lower power consumption—longer battery life.

The invention claimed is:

1. A method of measuring signal change including the steps of:
   receiving at an analogue circuit a first analogue input signal and performing at least one iteration step based on one or more non-linear dynamical functions on the first analogue input signal, or sample of the first analogue input signal, to produce a first iteration value;
   performing at least a second iteration step by repeating the at least one iteration step based on one or more non-linear dynamical functions on the first iteration value derived from the first analogue input signal to produce a second iteration value;
   receiving at the analogue circuit a second analogue input signal and performing at least one iteration step based on one or more non-linear dynamical functions on at least the second analogue input signal, or sample of the second analogue input signal, to produce a first iteration value from the second analogue input signal;
   performing at least a second iteration step for the second analogue input signal or the sample of the second analogue input signal by repeating the at least one iteration step based on one or more chaos functions on the first iteration value from the second analogue input signal or the sample of the second analogue input signal to produce a second iteration value;
   converting using an analogue to digital converter the iteration result values generated from the first and second analogue input signals in to digital words, and storing in memory means
   (i) iteration values generated from the first analogue input signal, or the sample of the first analogue input signal, and
   (ii) iteration result values generated from the second analogue input signal, or the sample of the second analogue input signal;
   operating a microcontroller to:
   subtract one set of iteration values generated from either the first or second analogue input signal or the samples of the first or second analogue input signals from the corresponding iteration values generated from the other analogue input signal or sample; and
   determine the difference between the first analogue input signal or the sample of said first analogue input signal and the second analogue input signal or the sample of the second analogue input signal by determining the number of iterations before the difference between the iteration result values increases, wherein the number of iterations before the difference between the iteration result values increases is proportional to the relative difference between the first analogue input signal and the second analogue input signal and/or the samples of the first analogue input signal and the second analogue input signal.

2. A method according to claim 1, wherein the method includes the step of performing a third iteration step on the first and/or second analogue input signals or the samples of the first analogue input signal and/or of the second analogue input signal thereof, whereby the second iteration value undergoes the at least one iteration step based on one or more non-linear dynamical functions to generate the third iteration values.

3. A method according to claim 1, wherein the one or more non-linear dynamical functions are chaos functions.

4. A method according to claim 1, wherein the iteration values and/or sample signatures of the first analogue input signal and/or of the second analogue input signal are converted to digital data or a digital word.

5. A method according to claim 4, wherein the iteration values are converted to any one or any combination of digital words, binary codes, reflected binary codes (Gray codes) and then stored.

6. A method according to claim 4, wherein the stored digital words for each iteration form a signature or data set related to that particular of the first analogue input signal and/or of the second analogue input signal or sample of first analogue input signal and/or the second analogue input signal.

7. A method according to claim 1, wherein the one or more nonlinear dynamical functions or chaos functions includes a one dimensional (D) discrete chaotic map.

8. A method according to claim 7, wherein the Chaos function is a Tent Map.

9. A method according to claim 7, wherein the Chaos function is a Logistic Map function.

10. A method according to claim 1, wherein the method includes at least one calibration step wherein the calibration step is a calibration by dilution step whereby the first and/or of the second analogue input signal is diluted by a predetermined amount and the corresponding divergence is calibrated.

11. A method according to claim 10, wherein the calibration step is a calibration by dilution step whereby each of one or more circuits performing iterations is calibrated using a very high resolution ADC measurement which relates each input value to its corresponding output value.

12. An apparatus to measure the difference between a first and at least a second signal and/or samples of a signal, said apparatus comprising:
   an analogue circuit adapted to
   receive a first analogue input signal and
   perform at least one of calculation based on one or more nonlinear dynamical functions on the first analogue input signal or sample of said first analogue input signal,
   to produce a first analogue iteration value derived from the first analogue input signal,
   whereby said analogue circuit is adapted to perform an iteration by repeating the at least one calculation based on one or more nonlinear dynamical functions on the first analogue iteration value derived from the first analogue input signal to produce a second iteration result value,
   said analogue circuit further adapted to
   receive a second analogue input signal and perform at least one of calculation based on one or more nonlinear dynamical functions on the second analogue input signal, or sample of the second analogue input signal, to produce a first analogue iteration value derived from the second analogue input signal or sample of the second analogue input signal, whereby said analogue circuit is further adapted to perform an iteration step for the second analogue input signal or sample of the second analogue input signal by repeating the at least one calculation based on one or more non-linear dynamical functions on the first iteration value derived from the second analogue input signal or the sample of the second analogue input signal to produce a second iteration result value;

an analogue to digital converter adapted to convert the iteration result values generated from the first and second analogue input signals in to digital words:

memory means adapted to store said digital words from the iteration result values generated from the first and second analogue input signals or the samples of the first analogue input signal and/or the second analogue input signal; and a microcontroller, adapted to either subtract the iteration result values from the first analogue input signal or sample of the first analogue input signal from the corresponding iteration values generated from the second analogue input signal or sample of said second analogue input signal, or vice versa; and determine the difference between the first analogue input signal, or sample of the first analogue input signal and the second analogue input signal, or sample of the second analogue input signal by determining the number of iterations before the difference between the iteration values increases, wherein the number of iterations before the difference between the iteration values increases is proportional to the relative difference between the first and second analogue input signals or samples of the first and second analogue input signals.

13. An apparatus to measure the difference between a first and at least a second signal and/or samples of a signal, said apparatus comprising:

memory means; and circuitry configured to:

perform at least one of calculation based on one or more nonlinear dynamical functions on a first input signal or sample of the first input signal, produce a first iteration value whereby said apparatus performs an iteration by repeating the at least one calculation based on one or more nonlinear dynamical functions on the first iteration value to produce a second iteration result value, perform at least one of calculation based on one or more nonlinear dynamical functions on at least a second input signal or sample of the second input signal, to produce a first iteration value from the second input signal or sample of the second input signal, and to perform an iteration step for the second input signal or sample of the second input signal by repeating the at least one calculation based on one or more non-linear dynamical functions on the first iteration value from the second input signal or the sample of the second input signal to produce a second iteration result value;

store the iteration result values generated from the first and second input signals or the samples of the first input signal and/or the second input signal in the memory means;

either subtract the iteration result values from the first input signal or sample of the first input signal from the corresponding iteration values generated from the second input signal or sample of the second input signal, or vice versa; and determine the difference between the first input signal, or sample of the first input signal and the second input signal, or sample of the second signal by determining the number of iterations before the difference between the iteration values increases, wherein the number of iterations before the difference between the iteration values increases is proportional to the relative difference between the first and second input signals or samples of the first and second input signals;

wherein said circuitry comprises circuits to perform the iteration calculation steps in series rather than repeating the iteration calculation steps on a same circuit.

14. An apparatus according to claim 12, wherein the circuitry is configured to:

take the second iteration value result derived from the first analogue input signal or sample of the first analogue input signal and perform a third and/or further iteration steps whereby the previous or earlier iteration result value undergoes the at least one calculation based on one or more non-linear dynamical functions to generate the third and/or further iteration result values; and take the second iteration value result from the second analogue input signal or sample of the second analogue input signal and perform a third and/or further iteration steps for the second analogue input signal or sample of the second analogue input signal, whereby the previous or earlier iteration result value undergoes the at least one calculation based on one or more non-linear dynamical functions to generate the second and/or further iteration result values.

* * * * *